(12) United States Patent
Heitzer

(10) Patent No.: US 10,380,219 B2
(45) Date of Patent: Aug. 13, 2019

(54) METHOD FOR COMPUTING SELF-CONTAMINATION PROCESSES OF A SPACECRAFT

(71) Applicant: Airbus DS GmbH, Taufkirchen (DE)

(72) Inventor: Joerg Heitzer, Immenstaad (DE)

(73) Assignee: AIRBUS DEFENCE AND SPACE GMBH, Taufkirchen (DE)

( * ) Notice: Subject to any disclaimer, the term of this patent is extended or adjusted under 35 U.S.C. 154(b) by 203 days.

(21) Appl. No.: 14/940,922

(22) Filed: Nov. 13, 2015

(65) Prior Publication Data
US 2016/0140082 A1    May 19, 2016

(30) Foreign Application Priority Data
Nov. 14, 2014 (EP) .................................. 14003838

(51) Int. Cl.
*G06F 17/50* (2006.01)
*G06F 17/13* (2006.01)
(Continued)

(52) U.S. Cl.
CPC ................ *G06F 17/11* (2013.01); *B64G 1/46* (2013.01); *G06F 17/13* (2013.01); *G06F 17/5009* (2013.01); *G06F 17/5095* (2013.01)

(58) Field of Classification Search
CPC ...... G06F 17/11; G06F 17/5009; G06F 17/13; G06F 17/5095; G06F 17/5036; G06F 17/5018; B64G 1/46
See application file for complete search history.

(56) References Cited

U.S. PATENT DOCUMENTS 7,620,221 B2 * 11/2009 Florent .................. A61B 6/547
 382/103
8,538,682 B1 * 9/2013 Vankatraman .......... G01S 19/27
 701/408
(Continued)

OTHER PUBLICATIONS

Theroude, C. "Outgassing Software User's Manual." Astrium SAS, MOS.UM.93694.ASTR, Issue 03, Rev 00, pp. 111-147 (Sep. 2010) [retrieved on Apr. 6, 2017]. Retrieved from <https://web.archive.org/web/20170404144715/http://ablemax.ipdisk.co.kr:5212/publist/HDD1/software/5.SYSTEMA/1.Systema/1.Systema_V3/3.Doc/gassing%203.2.32%20User%20Manual.pdf>.*
(Continued)

*Primary Examiner* — Aniss Chad
*Assistant Examiner* — Alfred H B Wechselberger
(74) *Attorney, Agent, or Firm* — Lorenz & Kopf LLP

(57) ABSTRACT

A method for computing self-contamination processes of a spacecraft by means of a data processing device comprising the following steps: receiving a first set of input parameters comprising general definitions of the spacecraft, receiving a second set of input parameters comprising control parameters for the spacecraft orbital data, physics, numeric, and a predetermined accuracy requirement of the computation, computing a self-contamination process of the spacecraft based on the received first and second sets of input data by either evaluating the analytical solution of a basic equation of emission or numerically solving the basic equation of emission for calculating a deposit of molecules outgassed from surfaces of the spacecraft with a numerical solver with the data processing device, wherein the numerical solver applies an adaptive stepsize control based on the preset accuracy requirement of the computation, and outputting the calculated deposit.

7 Claims, 9 Drawing Sheets

(51) Int. Cl.
  *G06F 17/11*    (2006.01)
  *B64G 1/46*     (2006.01)

(56)            References Cited

U.S. PATENT DOCUMENTS

| | | | | |
|---|---|---|---|---|
| 2003/0187626 | A1* | 10/2003 | Catto | G06F 19/701 |
| | | | | 703/11 |
| 2007/0244676 | A1* | 10/2007 | Shang | G06F 17/5018 |
| | | | | 703/2 |
| 2012/0197617 | A1* | 8/2012 | Mujagic | G06F 17/5027 |
| | | | | 703/7 |
| 2013/0116988 | A1* | 5/2013 | Zhang | G06F 8/10 |
| | | | | 703/2 |
| 2015/0317417 | A1* | 11/2015 | Fang | G06F 17/5018 |
| | | | | 703/2 |
| 2017/0061047 | A1* | 3/2017 | He | G06F 17/5009 |

OTHER PUBLICATIONS

Berzins, M. "An adaptive theta method for the solution of stiff and nonstiff differential equations." Applied Numerical Mathematics 9 (1992) 1-19 [retrieved on Aug. 1, 2017]. Retrieved from <http://www.sciencedirect.com/science/article/pii/016892749290063J>.*

Kuzmin, D. "Time-stepping techniques." [Lecture notes] (2007) [retrieved on Jun. 9, 2017].*

Soderlind, G. "Numerical Methods for Differential Equations." Numerical Analysis, Lund University (2008-2009) [retrieved on Aug. 3, 2017]. Retreived from <http://www.maths.lth.se/na/courses/FMN130/media/material/Chapter1.08a.pdf>.*

Mitchell, K. "Adaptive methods for ODEs." MACM 316 [retrieved on Aug. 1, 2017]. Retreived from <http://people.math.sfu.ca/~kam33/teaching/316-11.01/adaptive.pdf>.*

Barengoltz et al. "Modeling of internal contaminant dep" Proc. SPIE 1329; doi: 10.1117/12.22615 [retrieve Sep. 25, 2018]. Retrieve <https://www.spiedigitallibrary.org/conference-proceedings-of-spie/1329/0000/Modeling-of-internal-contaminant-deposition-on-a-cold-instrument-sensor/10.1117/12.22615.full> (Year: 1990).*

Rantanen, R. "Spacecraft Contamination Modeling" AIAA 12 Thermophysics Conference, Albuquerque, NM: 77-739 [retrieved from Sep. 25, 2018]. Retrieved from <https://arc.aiaa.org/doi/pdf/10.2514/6.1977-739> (Year: 1977).*

Aliyu et al. "Optimal Solution to Matrix Riccati Equation—For Kalman Filter Implementation" MATLAB: A Fundamental Tool for Scientific Computing and Engineering Applications, Chapter 4; doi:10.5772/46456 [retrieved on Mar. 28, 2019]. Retrieved from <https://www.intechopen.com/download/pdf/39345> (Year: 2012).*

Hundsdorfer et al. "Analysis of a multirate theta-method for stiff ODEs" Applied Numerical Mathematics, vol. 59, pp. 693-706 [retrieved fron Mar. 28, 2019]. Retrieved from <https://www.sciencedirect.com/science/article/pii/S0168927408000561> (Year: 2009).*

European Patent Office, European Search Report for European Patent Application No. 14003838 dated Jul. 1, 2015.

J.F. Roussel, et al. "Contamination Modelling Outgassing / Vent Analysis Tool", Final Project Presentation, Dec. 14, 1999, pp. 1-37.

Dmitri Kuzmin. "Time-Stepping Techniques", Lecture notes on Time-Stepping Techniques, 2007, pp. 1-21.

Eurpoean Space Agency and ONERA, "COMOVA Specification Website of the COMOVA Project", 2006.

J Sorensen, "Solar Orbiter Environmental Specification", Issue 3.0, Jun. 9, 2010, pp. 1-110.

Karam Robert, D., "Outgassing of Spacecraft Composites", 1987, Composite Structures 4, vol. 1, Analysis and Design Studies, pp. 45-58.

Scialdone John, J., "Self Contamination and Environment of an Orbiting Spacecraft", NASA Technical Note D-6645, May 1972, pp. 1-38.

M. Hässig, et al. "Spacecraft Outgassing a Largely Underestimated Phenomenon", 2011 2nd International Conference on Space Technology, Sep. 17, 2011, pp. 1-4, ISBN: 978-1-4577-1874-8.

Eesbeek Van M., Zwaal A, M., "Outgassing and Contamination Model Based on Residence Time", Proceedings of the Third European Symposium on Spacecraft Materials in Space Environment, Noordwijk, Oct. 1985, (ESA SP-232).

* cited by examiner

| Node 1 – analytical | Node 1 – numerical | Node 2 – analytical | Node 2 – numerical | Number of correct digits |
|---|---|---|---|---|
| 1.21092129476681 90e-12 | 1.21171106839557 06e-12 | 6.30254381433764 02e-14 | 6.30129934768579 72e-14 | 3 / 4 |
| 3.87107748306159 87e-09 | 3.87269092882382 32e-09 | 1.32342024281778 85e-10 | 1.32397160166803 19e-10 | 3 / 4 |
| 8.92642782657117 44e-14 | 8.92645633320492 34e-14 | 3.05407916448152 14e-15 | 3.05408891815102 41e-15 | 5 / 5 |

Fig. 3

METHOD FOR COMPUTING SELF-CONTAMINATION PROCESSES OF A SPACECRAFT

CROSS-REFERENCE TO RELATED APPLICATION

This application claims priority to European Patent Application No. 14 003 838.1, filed on 14 Nov. 2014, which is incorporated herein by reference in its entirety.

TECHNICAL FIELD

The embodiments described herein relate to a method for computing self-contamination processes of a spacecraft.

BACKGROUND

In addition, other objects, desirable features and characteristics will become apparent from the subsequent summary and detailed description, and the appended claims, taken in conjunction with the accompanying drawings and this background.

Self-contamination processes of a spacecraft such as a satellite may be caused by molecules, which outgas from surfaces of the spacecraft in vacuum, particularly from coatings, and are desorbed from the surfaces. Self-contamination may cause adverse changes of the characteristics of the surfaces, for example may degrade the spectral and directional characteristics of optical surfaces or the emissivity, absorptivity, and reflectivity of non-optical surfaces. The publication "Spacecraft outgassing, a largely underestimated phenomen", M-Hässig et al., $2^{nd}$ International Conference on Space Technology (ICST), 15-17 Sep. 2011, pages 1-4 Print ISBN: 978-1-4577-1874-8, discusses the problems caused by outgassing and contamination phenomena measured during the Rosetta spacecraft mission.

Since such adverse changes may be critical for space missions, analytical models based on numerical methods have been developed for computing self-contamination processes and determining adverse changes before the launch of a critical space mission. Due to the different materials used in modern spacecraft, self-contamination processes occur in highly different time scales. However, the numerical methods used in the known analytical models for computing self-contamination processes require very long computing times particularly at short time scales and usually produce numerical errors.

The European Space Agency (ESA) provides a software called COMOVA (Contamination Modelling Outgassing & Vent Analyses tool) for spacecraft molecular external contamination modelling. COMOVA allows the computation of contamination of spacecraft surfaces, but requires relatively long computing times. COMOVA may be also used within ESABASE2 Space Engineering Analysis Tool in order to provide computation of contamination deposits on surfaces, including the calculation of view factors and surface temperature effects.

SUMMARY

It is an objective to propose an improved method for computing self-contamination processes of a spacecraft.

The present embodiment proposes a novel algorithm for computing self-contamination processes of a spacecraft which consists of molecular emission and reemission fluxes from the surfaces of the spacecraft and which is described by a linear, inhomogeneous system of differential equations with time dependent coefficients. The emission process is calculated utilizing an analytical solution of the differential equation for temperature dependent emission underlying the problem of outgassing and self-contamination of different materials of a spacecraft. A numerical solver is proposed, which applies an adaptive stepsize control based on preset accuracy requirements of the computation to minimize the computing times. The proposed numerical solver can particularly use the theta-method, which allows solving the basic equation for deposit for time-dependent material parameters. The proposed solver can additionally use a higher order method e.g. the trapezium method to increase accuracy. The present embodiment allows a presetting of the accuracy requirements of the computation of self-contamination processes of a spacecraft, which enables a control of the computation time, particularly an acceleration of the computing of a solution.

An embodiment relates to a method for computing self-contamination processes of a spacecraft by means of a data processing device comprising the following steps: receiving a first set of input parameters comprising general definitions of the spacecraft, receiving a second set of input parameters comprising control parameters for the spacecraft orbital data, physics, numeric, and a predetermined accuracy requirement of the computation, computing a self-contamination process of the spacecraft based on the received first and second sets of input data by either evaluating the analytical solution of the basic equation of emission or numerically solving the basic equation of emission for calculating a deposit of molecules outgassed from surfaces of the spacecraft with a numerical solver with the data processing device, wherein the numerical solver applies an adaptive stepsize control based on the predetermined accuracy requirement of the computation, and outputting the calculated deposit.

A further embodiment relates to a computer program, which implements the method for computing self-contamination processes of a spacecraft according to the embodiment and as described herein and enables the computing of self-contamination processes of a spacecraft according to the embodiment when executed by a computer. Such a computer program could be integrated in a software suite for computing and simulating spacecraft.

According to a further embodiment, a record carrier storing a computer program according to the embodiment may be provided, for example a CD-ROM, a DVD, a memory card, a diskette, or a similar data carrier suitable to store the computer program for electronic access.

BRIEF DESCRIPTION OF DRAWINGS

The various embodiments will hereinafter be described in conjunction with the following drawing figures, wherein like numerals denote like elements, and:

FIG. 3 shows a table of test results compared to analytical results calculated for two nodes after a first timestep with a computer program implementing an embodiment of a method for computing self-contamination processes of a spacecraft according to an embodiment;

DETAILED DESCRIPTION

0. Basics of the Computation of Self-Contamination Processes of a Spacecraft

For computing self-contamination processes of a spacecraft, which particularly comprises different materials, the spacecraft is represented as a collection of surfaces, which are sub-divided into nodes (mesh elements) that have varying outgassing properties and emit and exchange contaminant mass. The contaminant molecules emitted by the surfaces and the bulk of the spacecraft move towards all spacecraft surfaces.

For computing a self-contamination process of a spacecraft with a data processing device such as a computer, which executes a computer program implementing basic steps of the embodiment, the data processing device receives two sets of input parameters. A first set of input parameters contains general definitions of the spacecraft such as parameters of the geometry of the spacecraft, properties of surfaces of the spacecraft, particularly outgassing/emission and reemission properties of the surfaces or coatings of the surfaces, and temperatures. A second set of input parameters contains control parameters for the spacecraft orbital data, physics, numeric, and predetermined accuracy requirements. The spacecraft orbital data typically comprise orbit definition and interpolation data and kinematics data. The control parameters for physics comprise data for atmosphere definition and transport definition. The control parameters for numeric may comprise parameters for raytracing and view factors, parameters regarding surfaces sensitive to contamination and to outgassing, and/or volume mesh data.

The data processing device processes the received input data for computing a self-contamination process of the spacecraft. The computation comprises calculating an analytical solution of a basic equation for calculating a deposit of molecules outgassed from surfaces of the spacecraft. The computation may be divided in two basic steps:

computation of view factors, i.e. the proportion of the total mass emitted by a node i and reaching node j, and solution of the integral equation of the deposit.

The view factors $F_{ij}$ between two surfaces mesh elements (nodes) i and j are calculated in a first step. The view factors can be defined at macroscopic level as the mass or the molecules emitted by node or surface mesh element i, which reach(es) node or surface mesh element j, divided by the entire mass or all molecules emitted by node or surface mesh element i. At a microscopic level, view factors $F_{ij}$ can be defined as the probability for a molecule emitted by node i reaching node j.

Figure 1:
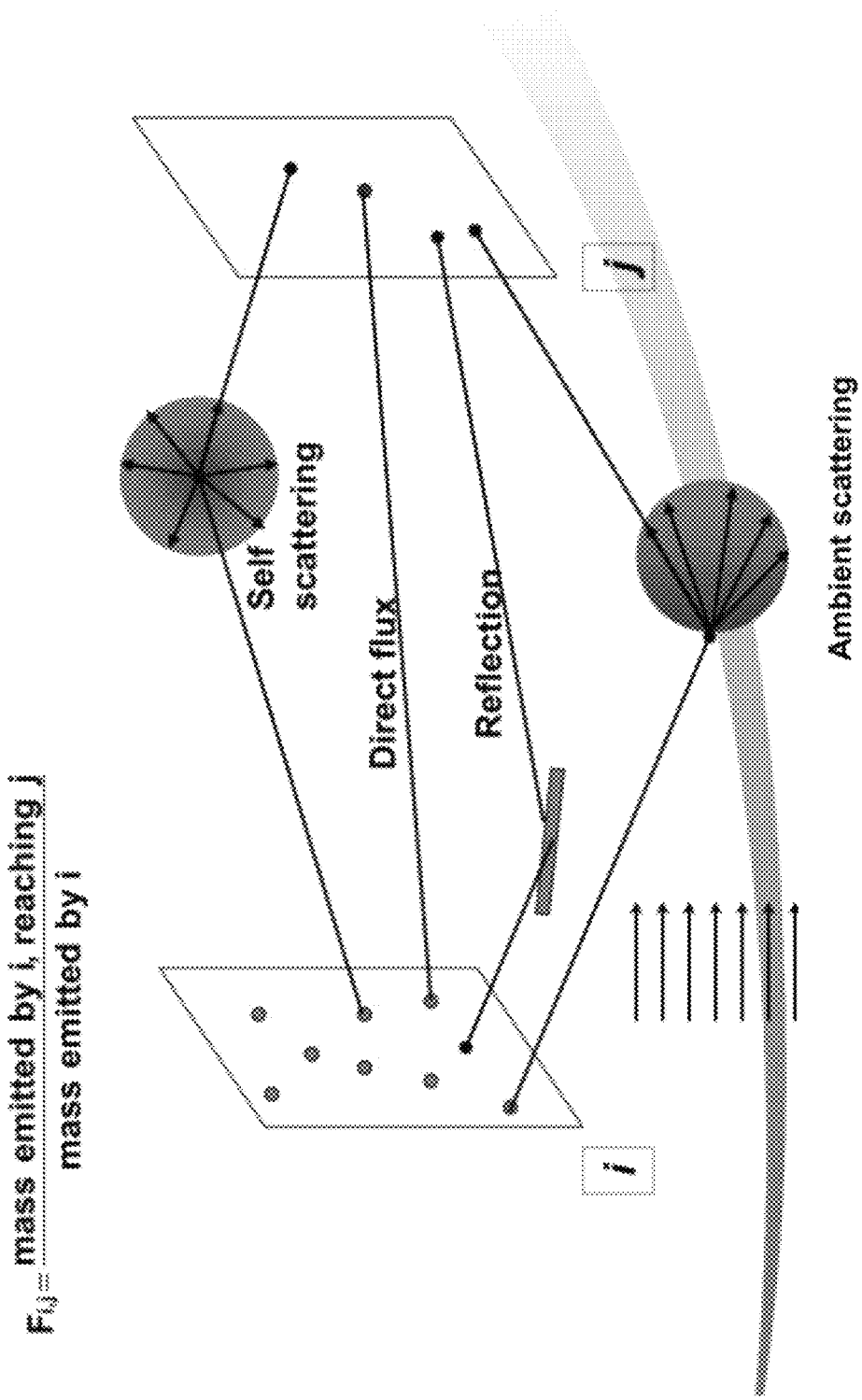
FIG. 1 shows schematically the process of self-contamination by means of two surfaces i and j.

As shown in FIG. 1, the transfer of mass between two nodes i and j comprises direct flux, flux scattered by other contaminant molecules (self-scattering), flux scattered by ambient gas flux (ambient gas scattering), and flux reemitted from spacecraft surfaces.

The view factors $F_{ij}$ can be determined by a Monte-Carlo ray-tracing as briefly explained in the following: a node i randomly emits a large number of rays, which represent the outgassed molecules. The emission of rays can be performed as follows: emission points are sampled according to an iso-distribution law; emission directions are sampled according to Lambert's law. The mean free path $\lambda_a$ is based on Robertson formula where the cross-section is computed by the Hard Sphere model. For each ray, a collision distance $d_c$ is sampled at random according to the collision probability law $P(x)=e^{-x/\lambda_a}$, where x is the distance and $\lambda_a$ is the mean free path. By comparing the distance, the molecule is either scattered or impinges the node j. If $d_c<d_{ij}$, a collision is accepted, otherwise it is rejected. If a collision is rejected, the molecule reaches node j and contributes to $F_{ij}$. If a collision is accepted, the molecule is reemitted from the collision point with a random direction and reaches the node k and contributes to $F_{ik}$.

After calculating the view factors $F_{ij}$, the mass deposit can be calculated as briefly outlined in the following: the nodes i, j, k, . . . form a network where each pair of elements i, j or i, k or j, k is related by their view factors $F_{ij}$, $F_{ik}$ or $F_{jk}$. Each element has emission, deposition and reemission of deposited contaminants that depend on the temperature. Thus, this problem becomes an inhomogeneous system of differential equations of first order with time dependent coefficients, which can be solved by the inventive solution as explained in the following in detail.

The computation steps according to the inventive solution and as described in the following can be implemented in a computer program such as an additional module or plug-in for the above mentioned COMOVA-software and can significantly reduce the computation time required for computing self-contamination processes of spacecraft consisting of different materials with different and time-dependent outgassing and desorbing behavior.

Calculation of Deposits

0. The Basic Equation for Deposit

The equation (as defined in the OUTGASSING Software User's Manual, internal document identification MOS.UM.93694.ASTR, on page 136, equation (72), $$W_{d,i}^{\bullet} = W_{d,i}^n \zeta_i + \frac{S_i^n}{A_{i,j}}(\zeta_i - 1) + \sum_j \frac{F_{j,i} W_{e,j}^n}{1 + A_{i,j}\tau_{e,j}}\left(\zeta_i - \exp\left(-\frac{\Delta t}{\tau_{e,j}}\right)\right);$$

simplified form of the equation can be found in Van Eesbeek M., Zwaal A., "Outgassing and Contamination Model Based on Residence Time", Proceedings of the Third European Symposium on Spacecraft Materials in Space Environment, Noordwijk, October 1985, (ESA SP-232)) for the deposit on a node "i" that is to be solved is as follows:

$$\dot{W}_{dep,i} = \left(\frac{F_{ji} - \delta_{ij}}{\tau_{r,j}}\right)W_{dep,j} + F_{ji}\dot{W}_{emitted,j}$$

$$\dot{W}_{emitted,j} = \frac{1}{\tau_{e,j}}W_{emittable,j} = -\dot{W}_{emittable,j}$$

wherein $F_{ji}$ denotes a view factor from node j (first surface mesh element) to node i (second surface mesh element), $\tau_{r,j}$ denotes the temperature-dependent reemission time of node j, $\tau_{e,j}$ denotes the temperature-dependent emission time of node j. In the following, the derivation of a numerical solver for SYSTEMA/OUTGASSING that applies adaptive step-size control based on accuracy requirements to minimize calculation time according to the embodiment is described. A general formulation of the numerical scheme is presented using the theta (-method. It allows solving the deposit equation for time dependent material parameters. The explicit and implicit first order Euler schemes were identified as the most promising combination. The algorithms according to an embodiment were implemented in MATLAB and C++ and applied to the various models.

2 Calculation of the Local Truncation Error (LTE) of the Theta (Θ)-Method

Figure 2:
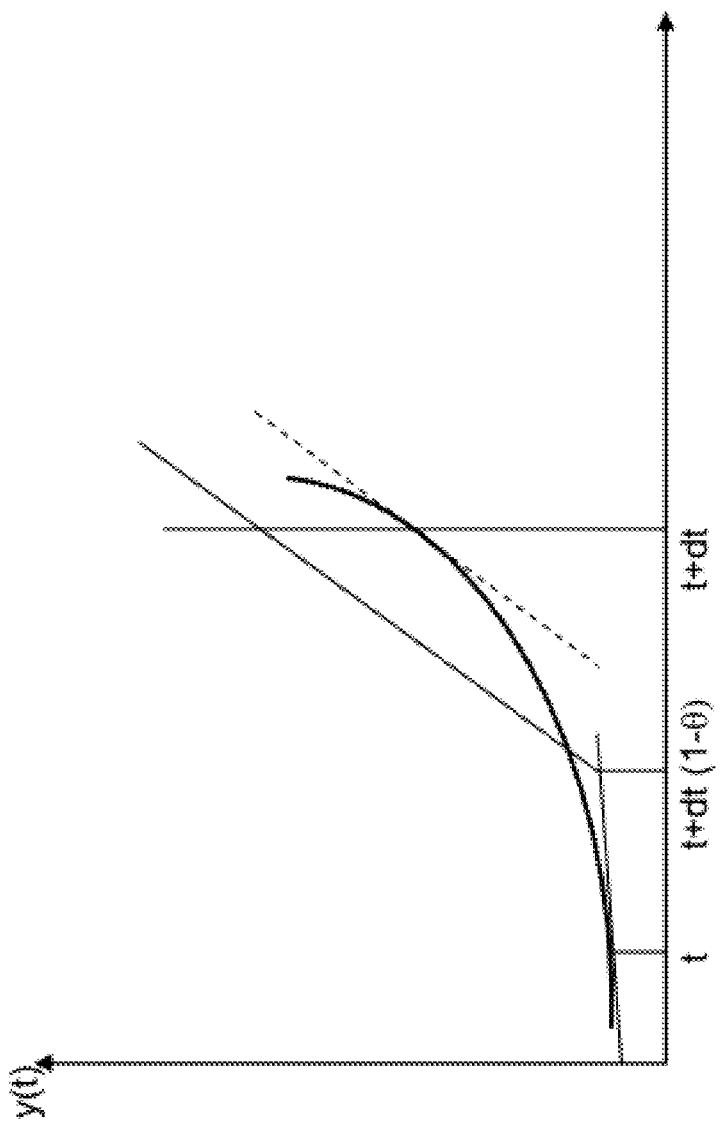
FIG. 2 shows a graph with a timestep dt for demonstrating the principle the method according to the embodiment.

The principle of the theta-method is depicted by FIG. 2:

The timestep dt is split into two parts. During the first part $dt(1-\Theta)$ the solution is propagated along the slope at time t. At time $t+dt(1-\Theta)$ the solution is propagated along the slope at time t+dt.

The explicit as well as the implicit Euler-scheme can be considered as special cases of the Θ-method.

Thus, the LTE for this method can be derived first and the LTEs for the two Euler methods can be deduced from it.

Given the Initial Value Problem $$\dot{y}(t)=f(t, y(t)), \ t \in [0, T_{final}], \ y(0)=y_0$$

and assuming that at time $t_n=nh$ the solution $y(t_n)$ is exact, the local truncation error LTE is defined by $$y(t_{n+1})=y(t_n)+h[\Theta f(t_{n+1}, y(t_{n+1}))+(1-\Theta)f(t_n, y(t_n))]+ LTE \quad (5)$$

Observing that $f(t_{n+1}, y(t_{n+1}))=\dot{y}(t_{n+1})$ and expanding forward $$y(t_{n+1}) = y(t_n) = h\dot{y}(t_n) + \frac{1}{2}h^2\ddot{y}(t_n) + \frac{1}{6}h^3\dddot{y}(t_n) + O(h^4) \quad (6)$$

and using $$\frac{d}{dt}y(t_{n+1}) = \dot{y}(t_n) + h\ddot{y}(t_n) + \frac{1}{2}h^2\dddot{y}(t_n) + O(h^4) \quad (7)$$

Solving eq. (5) for LTE and inserting eqs. (6) and (7) yields $$LTR = \ddot{y}(t_n)h^2\left(\frac{1}{2}-\Theta\right) + \dddot{y}(t_n)h^3\left(\frac{1}{6}-\frac{\Theta}{2}\right) + O(h^4) \quad (8)$$

In case $$\frac{1}{2} = \Theta$$

the trapezoidal rule is get, which is consistent of order 2 with $LTE \approx h^3$, in all other cases the Θ-method is of order 1.

Now, the LTEs for the Euler methods can be calculated:

Explicit Euler method (Θ=0):

$$LTE = \frac{1}{2}\ddot{y}(t_n)h^2 + O(h^3) \quad (9)$$

Implicit Euler method (Θ=1):

$$LTE = -\frac{1}{2}\ddot{y}(t_n)h^2 + O(h^3) \quad (10)$$

0. Calculation of the stepsize using the local truncation error. The LTE can be written in the form of a remainder term in the Taylor series. Two series with two different values $$\frac{1}{2} \neq \Theta_1, \frac{1}{2} \neq \Theta_2$$

can be defined:

Assuming that $y(t_n)$ was the exact solution of eq. (5), the exact solution at time $t_{n+1}$ can be expanded as a Taylor series with remainder:

$$y(t_{n+1}, \Theta_1) = y(t_n) + \quad (11)$$
$$h[\Theta_1 f(t_{n+1}, y(t_{n+1})) + (1-\Theta_1)f(t_n, y(t_n))] + \ddot{y}(\xi_1)h^2\left(\frac{1}{2}-\Theta_1\right)$$

and $$y(t_{n+1}, \Theta_2) = y(t_n) +$$
$$h[\Theta_2 f(t_{n+1}, y(t_{n+1})) + (1-\Theta_2)f(t_n, y(t_n))] + \ddot{y}(\xi_2)h^2\left(\frac{1}{2}-\Theta_2\right)$$

with $$\xi_i \in [t_n, t_{n+1}].$$

As the remainder term is unknown we can only approximate the solution at time $t_{n+1}$:

$$w(t_{n+1}, \Theta_1)=y(t_n)+h[\Theta_1 f(t_{n+1}, y(t_{n+1}))+ (1-\Theta_1)f(t_n, y(t_n))] \quad (11)$$

$$v(t_{n+1}, \Theta_2)=y(t_n)+h[\Theta_2 f(t_{n+1}, y(t_{n+1}))+ (1-\Theta_2)f(t_n, y(t_n))] \quad (12)$$

Subtracting eqs. (11) from (12):

$$w(t_{n+1}, \Theta_1) - y(t_{n+1}, \Theta_1) = -\ddot{y}(\xi)h^2\left(\frac{1}{2}-\Theta_1\right) \quad (13)$$

$$v(t_{n+1}, \Theta_2) - y(t_{n+1}, \Theta_2) = -\ddot{y}(\xi)h^2\left(\frac{1}{2}-\Theta_2\right)$$

Here it was used that for sufficiently smooth functions $\xi_1 \approx \xi_2 \approx \xi$.

As it has been assumed that $y(t_{n+1}, \Theta_i)$ was the exact solution at time $t_{n+1}$, eqs. (13) can be subtracted from each other to calculate an estimate for the second derivative:

$$\ddot{y}(\xi)h^2 \cong \frac{w(t_{n+1}, \Theta_1) - v(t_{n+1}, \Theta_2)}{\Theta_1 - \Theta_2} \quad (14)$$

Comparing eqs. (8) with eqs. (14) it can be seen (only the smallest power of h is relevant):

$$LTE(\Theta_i) = \ddot{y}(\xi)h^2\left(\frac{1}{2}-\Theta_i\right) = \left(\frac{1}{2}-\Theta_i\right)\frac{w(t_{n+1}, \Theta_1) - v(t_{n+1}, \Theta_2)}{\Theta_1 - \Theta_2} \quad (15)$$

The truncation error of any of the two series expansions at a certain step can thus be expressed by the difference of the two calculated function values at that step.

Using the explicit and the implicit Euler method ($\Theta_1=0$, $\Theta_2=1$) yields truncation errors of $$LTE_{explicit} = \left(\frac{1}{2} - \Theta_1\right)\frac{w(t_{n+1}, \Theta_1) - v(t_{n+1}, \Theta_2)}{\Theta_1 - \Theta_2} \quad (16)$$

$$= -\frac{1}{2}(w(t_{n+1}, \Theta_1) - v(t_{n+1}, \Theta_2))$$

and $$LTE_{implicit} = \left(\frac{1}{2} - \Theta_2\right)\frac{w(t_{n+1}, \Theta_1) - v(t_{n+1}, \Theta_2)}{\Theta_1 - \Theta_2}$$

$$= \frac{1}{2}(w(t_{n+1}, \Theta_1) - v(t_{n+1}, \Theta_2))$$

for each of the expansions.

In the above example both LTE's have the same magnitude. Usually one would chose the LTE which has the smallest magnitude to determine the series expansion along which the solution is propagated. In the sequel this expansion shall be called "propagator" and the other one "estimator". In addition to the LTE the stability has to be taken into account. In the above example, although the magnitudes of both LTEs are equal, one would choose the implicit expansion to propagate the solution because the explicit Euler scheme becomes instable if the timesteps become too large.

Provided that $$\frac{1}{2} \neq \Theta_i$$

the LTE can made arbitrarily small by reducing the stepsize h. For practical purposes it is sufficient that the LTE does not exceed a given tolerance TOL. The local truncation error TOL that is compatible with the tolerance requirement can be realized by a certain timestep $h_{tol}$ so that $$TOL = \ddot{y}(\xi_{tol})h_{tol}^2\left(\frac{1}{2} - \Theta_i\right) \quad (17)$$

while $$LTE(\Theta_i) = \ddot{y}(\xi_{lte})h_{lte}^2\left(\frac{1}{2} - \Theta_i\right)$$

Now requesting $LTE(\Theta_i) = TOL$ and assuming $\ddot{y}(\xi_{tol}) \cong \ddot{y}(\xi_{lte})$ leads to $$h_{tol} = h_{lte}\sqrt{\frac{TOL}{LTE(\Theta_i)}} \quad (18)$$

with the LTE given by eq. (16).

This equation defines the strategy for choosing the stepsize:

Chose a stepsize $h_{lte}$ and calculate the pertaining LTE

If LTE<=TOL accept the step, calculate the next stepsize by eq. (18)

If LTE>TOL repeat the step, calculate the stepsize for the retry by eq. (18)

This strategy may not always be successful. If the stiffness increases as compared to the last step the LTE may exceed the tolerance and the calculation will be repeated with a smaller timestep. If the LTE is small enough, the step is accepted and the next step is calculated using the timestep of the last successful step. If not, the timestep is decreased once more.

If on the other hand the LTE is smaller than the tolerance, the next timestep is increased according to eq. (18).

The method outlined is capable of detecting stiffness changes and can adapt itself. It is important to note, that the calculation of the next timestep depends on the LTE of the current timestep and thus is a mere estimate.

0. Stepsize Strategy and to Tolerance Criteria for a System of Differential Equations If a system of equations has to be solved, a LTE can be calculated for each nodepair $w, v$ according to eq. (16).

In order to get the process started a stepsize $h_{lte}$ is chosen that gives rise to a LTE according to eq. (16).

Then at time $t_n$ a vector of LTEs is calculated from all propagator-estimator pairs according to $$LTE_m(\Theta_{prop}) = \left(\frac{1}{2} - \Theta_{prop}\right)\frac{w_m(t_n, \Theta_1) - v_m(t_n, \Theta_2)}{\Theta_1 - \Theta_2} \quad (19)$$

where $\Theta_{prop}$ is either $\Theta_1$ or $\Theta_2$ depending on which one was chosen as the propagator.

The next stepsize is then taken to be the minimum of all that were calculated:

$$h_{tol} = \min\left(h_{lte}\sqrt{\frac{TOL}{LTE_m(\Theta_{prop})}}\right) \quad (20)$$

In the above formula TOL does not necessarily have to be a scalar, it can be specified for each node so that $$h_{tol} = \min\left(h_{lte}\sqrt{\frac{TOL_m}{LTE_m(\Theta_{prop})}}\right) \quad (21)$$

The tolerances $TOL_m$ that are applied at time $t_n$ in the calculation of the next timestep are calculated from two user supplied values $TOL_{m,abs}$ and $TOL_{rel}$ according to the following rule:

If $u_m(t_n, \Theta_{prop}) > TOL_{m,abs}$ $$TOL_m = TOL_{rel}u_m(t_n, \Theta_{prop}) \quad (22)$$

else $TOL_m = TOL_{m,abs}$ where $u_m(t_n, \Theta_{prop})$ is either $w_m(t_n, \Theta_1)$ or $v_m(t_n, \Theta_2)$ depending on which one was selected as propagator. Eq. (22) implies that the tolerance requirements relax when the solution is close to zero.

0. Discretizing the Basic Equation for Deposit i. Direct Integration of the Emission Term In the case of N outgassing nodes the equation to be solved has the form:

$$\dot{W}_{dep,i} = \left(\frac{F_{ji} - \delta_{ij}}{\tau_{r,j}}\right)W_{dep,j} + F_{ji}\dot{W}_{emitted,j} \quad (23)$$

with $$\dot{W}_{emitted,j} = \frac{1}{\tau_{e,j}}W_{emittable,j} = -\dot{W}_{emittable,j} \quad (24)$$

Eq. (23) can be written more conveniently using matrix notation:

$$\dot{W}_{dep,i} = G_{il}R_{lm}W_{dep,m} + F_{ji}E_{jl}W_{emittable,l} \quad (25)$$

Where $G_{il} = F_{li} - \delta_{il}$ is the geometriematrix and $R_{lm}$, $E_{jl}$ are diagonalmatrices of the form $$R_{lm} = \begin{pmatrix} \tau_{r,1}^{-1} & 0 & & 0 \\ 0 & \cdots & & \\ & & \cdots & 0 \\ 0 & & 0 & \tau_{r,N}^{-1} \end{pmatrix}$$

and $$E_{jl} = \begin{pmatrix} \tau_{e,1}^{-1} & 0 & & 0 \\ 0 & \cdots & & \\ & & \cdots & 0 \\ 0 & & 0 & \tau_{e,N}^{-1} \end{pmatrix}$$

Matrices $R_{lm}$ and $E_{jl}$ are time dependent because they contain the time dependent material parameters $\tau_r$, $\tau_e$. Time dependency enters through the temperature of the node which depends on the trajectory and can be highly nonlinear. In such a case an analytical expression for $W_{emittable}$ cannot be found and the equations for $W_{emittable}$ and $W_{dep}$ have to be solved simultaneously:

Introducing a New Variable $W = (W_{dep}, W_{emittable})^T$ eqs. (23) and (24) can now be written as a linear, homogeneous system of differential equations:

$$\dot{W} = \begin{pmatrix} GR & FE \\ 0 & -E \end{pmatrix} \begin{pmatrix} W_{dep} \\ W_{emittable} \end{pmatrix} = MW \quad (26)$$

Applying the theta-method to this equation results in a recursion formula for $W(t_{n+1})$ at time $t_{n+1} = (n+1)h$ $$W_l(t_{n+1}, \Theta_i) = W_l(t_n) + h[\Theta_i M_{lm}(t_{n+1})W_m(t_{n+1}) + (1-\Theta_i)M_{lm}(t_n)W_m(t_n)] \quad (27)$$

The relative and absolute tolerances needed to calculate the tolerance requirement of every node according to eq. (22), however, would now be applied to all nodes. This is a drawback because even in the case of constant temperature equation (24) describing the emission is always only calculated with the precision goal required for the deposit while it could have been calculated to arbitrary precision using the analytical solution. Thus a lot of precision is lost while at the same time the computation time is increased disproportionately because the matrix size has quadrupled.

i. Stepwise Analytical Integration of the Emission Term

1. General Solution

If, on the other hand, a solution for $W_{emittable}$ were available, the computation time could be decreased significantly because the theta-method usually requires the solution of an equation system due to the implicit character of the method. Halving the number of equations can thus reduce the computation time by up to a factor of 8.

It shall now be derived an analytical solution for $W_{emittable}$ based on the linear approximation of $\tau_e$ in the time interval $h = t_{n+1} - t_n$ where $h$ are the timesteps that are calculated according to eq. (21).

Eq. (23) can be written in the form $$\dot{W}_{dep,i} = A_{ij}(t)W_{dep,j} - F_{ji}\dot{W}_{emittable,j} \quad (28)$$

The equation can be integrated in the interval $t \in [t_N, t_{N+1}]$:

$$\int_{t_n}^{t_{n+1}} dW_{dep,i} = \int_{t_n}^{t_{n+1}} A_{ij}(t)W_{dep,j} \, dt - F_{ij}\int_{t_n}^{t_{n+1}} \dot{W}_{emittable,j} \, dt \quad (29)$$

Applying the theta-method to the first term on the right side:

$$W_{dep,i}(t_{n+1}) - W_{dep,i}(t_n) = \quad (30)$$
$$h[\Theta \, A_{ij}(t_{n+1})W_{dep,j}(t_{n+1}) + (1-\Theta)A_{ij}(t_n)W_{dep,j}(t_n)] -$$
$$F_{ji}\int_{t_n}^{t_{n+1}} dW_{emittable,j}$$

with $F_{ji} \int_{t_n}^{t_{n+1}} dW_{emittable,j} = \quad (31)$ $$F_{ji}(W_{emittable,j}(t_{n+1}) - W_{emittable,j}(t_n)) = F_{ji}\Delta W_{emittable,j}$$

Here $\Delta W_{emittable,j}$ is the quantity of material emitted from the bulk during the time interval $t_{n+1} - t_n$ which is then distributed in the structure through the visibility matrix.

In order to calculate $\Delta W_{emittable,j}$ the linear transformation is introduced $$t' = t - t_n, \quad t' \in [0, t_{n+1} - t_n]$$

so that the emission equation takes the form $$\dot{W}_{emittable,j}(t') = -\frac{W_{emittable,j}(t')}{\tau_{e,j}(t'=0) + \alpha_j t'} \quad (32)$$

with $W_{emittable,j}(t'=0) = W_{emittable,j}(t_n)$ where $\alpha_j$ is the secant slope defined by $$\alpha_j = \frac{\tau_{e,j}(t_{n+1}) - \tau_{e,j}(t_n)}{t_{n+1} - t_n}$$

and is constant in the interval. (33)

Equation (32) can be integrated in closed form to yield:

$$W_{emittable,j}(t') = W_{emittable,j}(t_n)\left(\frac{\tau_{e,j}(t_n)}{\tau_{e,j}(t_n) + \alpha_j t'}\right)^{\frac{1}{\alpha_j}} \quad (34)$$

As $W_{emittable,j}(t = t_{n+1}) = W_{emittable,j}(t' = h)$ $$= W_{emittable,j}(t_n)\left(\frac{\tau_{e,j}(t_n)}{\tau_{e,j}(t_n) + \alpha_j h}\right)^{\frac{1}{\alpha_j}}$$

it is now possible to calculate the desired quantity $\Delta W_{emittable,j}$:

$$\Delta W_{emittable,j} = W_{emittable,j}(t_n)\left(1 - \left(\frac{\tau_{e,j}(t_n)}{\tau_{e,j}(t_n) + \alpha_j h}\right)^{\frac{1}{\alpha_j}}\right) \quad (35)$$

Starting at $t=0$ with the known quantity $W_{emittable,j}(t=0)$ the amount of emitted material during each timestep $h$ can be recursively calculated and inserted into eq. (30) to calculate $W_{dep,i}(t_{n+1})$.

1. Approximation for Small Slopes

In the form given by eq. (34) vanishing slopes lead to a singularity so that the case of constant temperature cannot be calculated. This can be overcome by expanding eq. (34) for small values of $\alpha_j$:

$$\Delta W_{emittable,j} \cong W_{emittable,j}(t_n)\left(1 - \exp\left(-\frac{\Delta t}{\tau_{e,j}(t_n)}\right)\left(1 + \frac{(\Delta t)^2 \alpha_j}{2\tau_{e,j}^2(t_n)}\right)\right) \quad (36)$$

For vanishing slope the known analytical solution is thus recovered. In the numerical implementation a threshold value for the slope can be defined below which eq. (36) is used instead of eq. (34).

0. Selecting $\Theta_1$ and $\Theta_2$

Numerical experiments showed that setting $\Theta_1=0$, $\Theta_2=1$ (explicit and implicit Euler method) with the implicit method as the propagator was the best tradeoff between speed and accuracy: Choosing $\Theta_1>0$, $\Theta_2=1$ yielded a slightly better accuracy at the expense of a doubled computation time because both equations are now implicit. Setting $\Theta_1 \geq 0$, $\Theta_2 < 1$ on the other hand produced negative deposits when the values approached zero because the propagator now is only A-stable instead of L-stable.

The timesteps that the algorithm computes do not meet the stability criteria for an explicit method. In order to prevent the estimator from diverging, its new value was computed using the propagator value of the last timestep. The new values for propagator and estimator were computed according to the expression $$W_{dep,i}(t_{n+1}) - W_{dep,i}(t_n) = \quad (37)$$

$$h\Theta A_{ij}(t_{n+1})W_{dep,j}(t_{n+1}) - F_{ji}\int_{t_n}^{t_{n+1}} dW_{emittable,j}$$

EXAMPLES 2.1 Constant Temperature

In a first test results calculated with the numerical solver were compared to those calculated with the analytical solver (Analytical solver for SYSTEMA/OUTGASSING ACE82.TN.ASTR.00004). The test case was an electronic box at a uniform constant temperature of 377° K.

The table in FIG. 3 outlines the results for nodes 1 and 2 after the first timestep, in the middle and at the end of the iterations:

Although in the numerical solution a relative error of only 1e-2 was required, up to 5 digits were computed correctly.

The CPU times needed were 246 sec (analytical) vs. 7 sec (numerical).

2.2 Variable Temperature

As an example for variable temperature the full BepiColombo geometry with the complete trajectory was chosen. The model was comprised of 9909 nodes. The aim was the calculation of deposit on the hottest node of the structure.

The parameters were:

Relative error: 1e-2

Absolute error: 2.56e-9 kg/m² (corresponds to 1e-11 kg on node 6132)

Max. stepsize: 250 h The results are depicted in FIGS. 4-7

Figure 4:
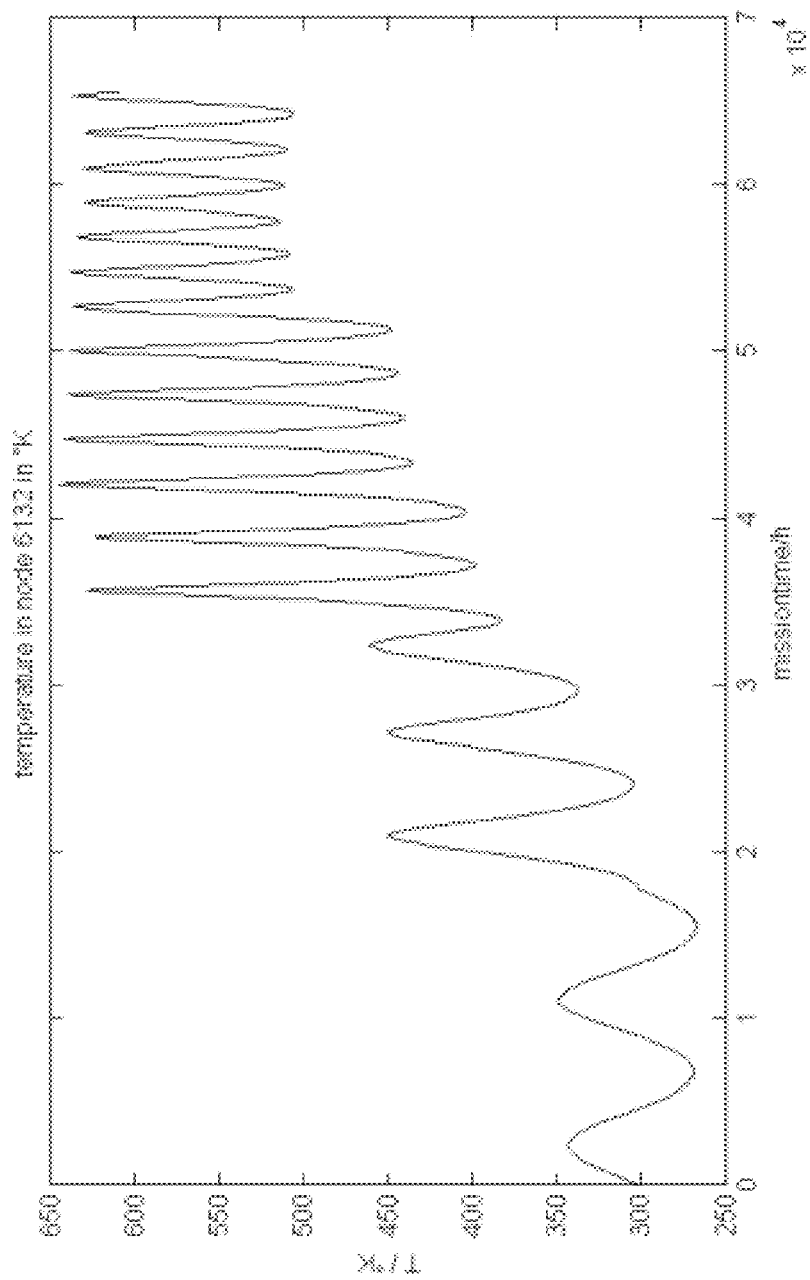
FIGS. 4-7 show diagrams of the computation results of the method used to compute self-contamination for the full BepiColombo geometry with the complete trajectory.
Figure 5:
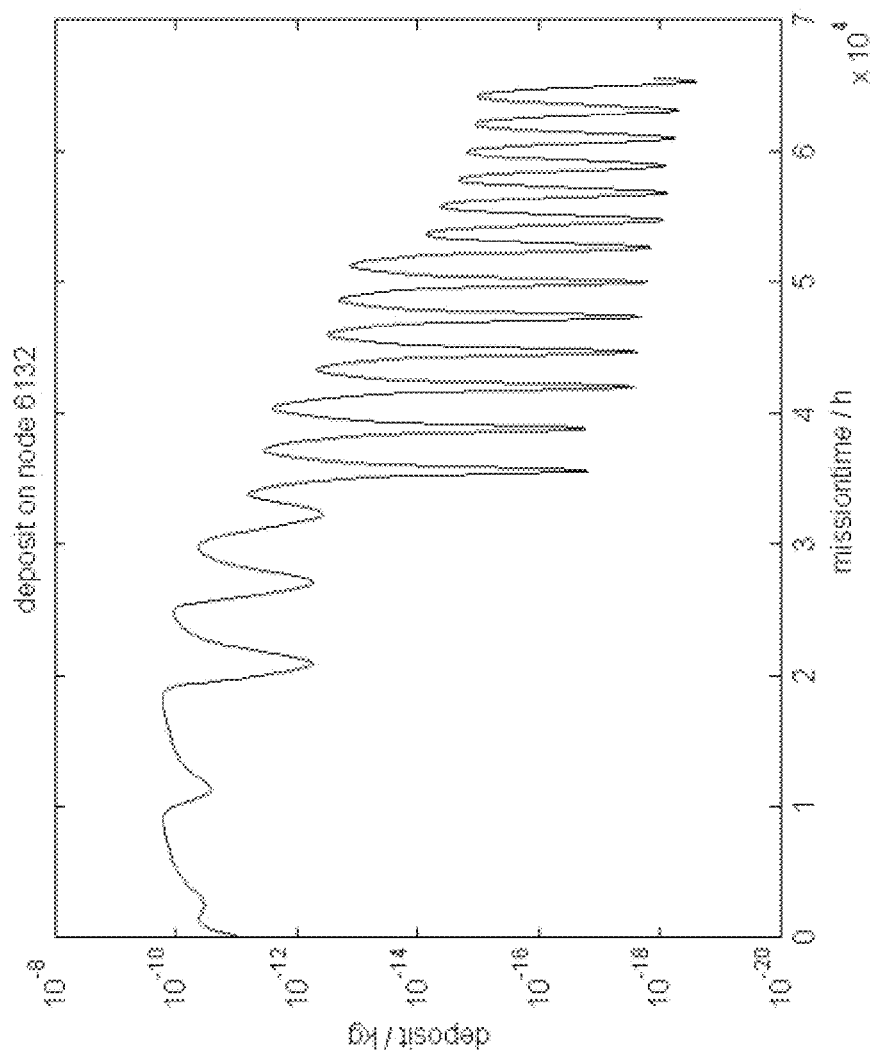
Figure 6:
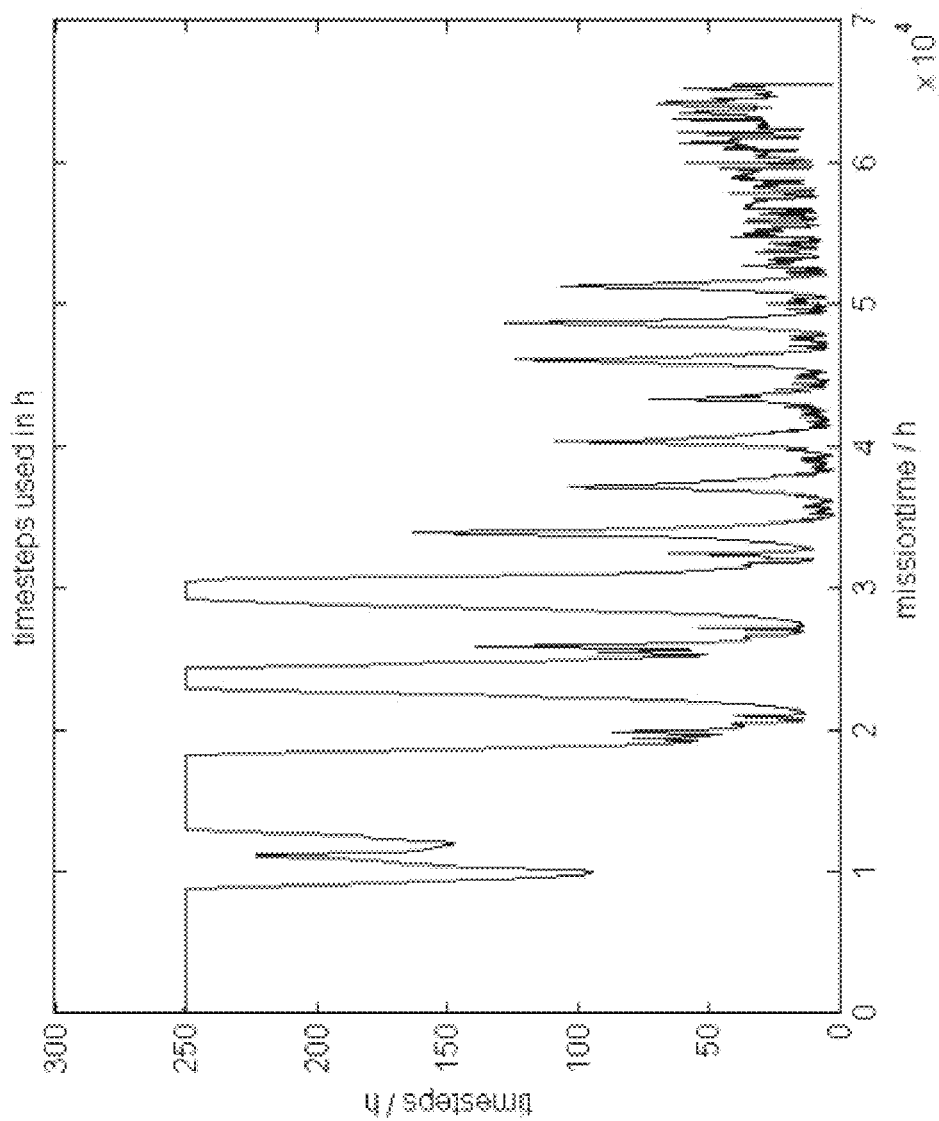
Figure 7:
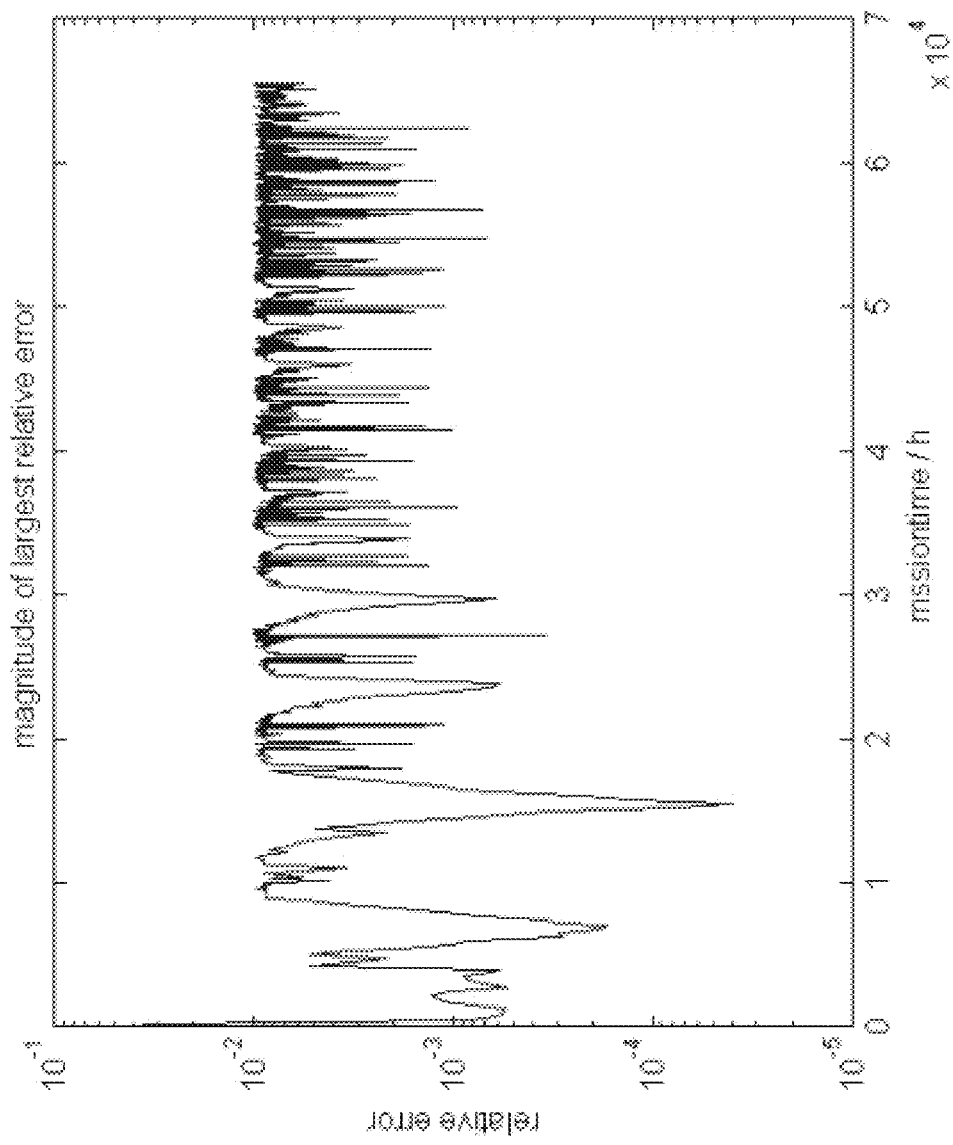

The deposits faithfully follow the form of the temperature curve becoming lower when temperatures rise and vice versa (FIGS. 4 and 5). The timesteps become smaller when the temperatures rise and are limited to 250 h (FIG. 6). The relative error was computed by dividing the LTE by the deposit. The requested accuracy is maintained in a stable way except for the times when the timesteps are limited to 250 h: Here the algorithm wanted to use a larger timestep and answers to the limitation with a better accuracy (FIG. 7).

The results were reproduced with a C++-implementation using the standard LAPACK library with the results being identical to at least 12 digits.

Calculation Times:

C++ (1CPU+standard LAPACK): 536055 sec

MATLAB (4CPUs+multithreading+INTEL-MKL lib): 47290 sec

0. Improving Accuracy

It is in principle not possible to calculate the absolute error of a numerical method because an analytical solution is not available, else one would have used it in the first place. For the problem at hand an analytical solution can be formulated (Analytical solver for SYSTEMA/OUTGASSING ACE82.TN.ASTR.00004) albeit it is valid only for constant temperatures and needs numerical linear algebra to calculate the diagonalization of the problemmatrix. The deviation of the numerically derived solution from the true solution can therefore be assessed and different numerical methods can be compared. This approach was in fact used to determine the choice of $\Theta_1=0$, $\Theta_2=1$ as the final setting in the implementation of the method. It had been proofed that through the use of the implicit Euler method as the propagator of the solution a stable behaviour could be achieved. Nevertheless the order of convergency is only one. To improve the order of convergency while at the same time retaining A-stability one's choice is limited: The only linear multistep method is the trapezium method which is of order two and exhibits A-stability. It was therefore decided to implement the trapezium method in addition to the two theta-methods and use its results to propagate the solution while the theta-methods were used to calculate the timesteps. Integration took place according to the following formula:

$$\left(\delta_{ij} - \frac{h}{2}A_{ij}(t_{n+1})\right)W_{dep,j}(t_{n+1}) = \quad (38)$$

$$\left(\delta_{ij} + \frac{h}{2}A_{ij}(t_n)\right)W_{dep,j}(t_n) - F_{ji}\int_{t_n}^{t_{n+1}} dW_{emittable,j}$$

The integral on the right hand side was also calculated using the trapezium rule. To speed up the calculation the equations system was solved using the PARDISO solver which is a part of the INTEL MKL library. This solver is optimized for sparse matrices and speeds up the calculation by a factor of up to 20.

0. Results

The geometry of an electronic box was used as an example. It comprises 738 nodes of which some were kept at constant temperatures between 0 and 300° K while the rest was kept at 325° K.

Figure 8:
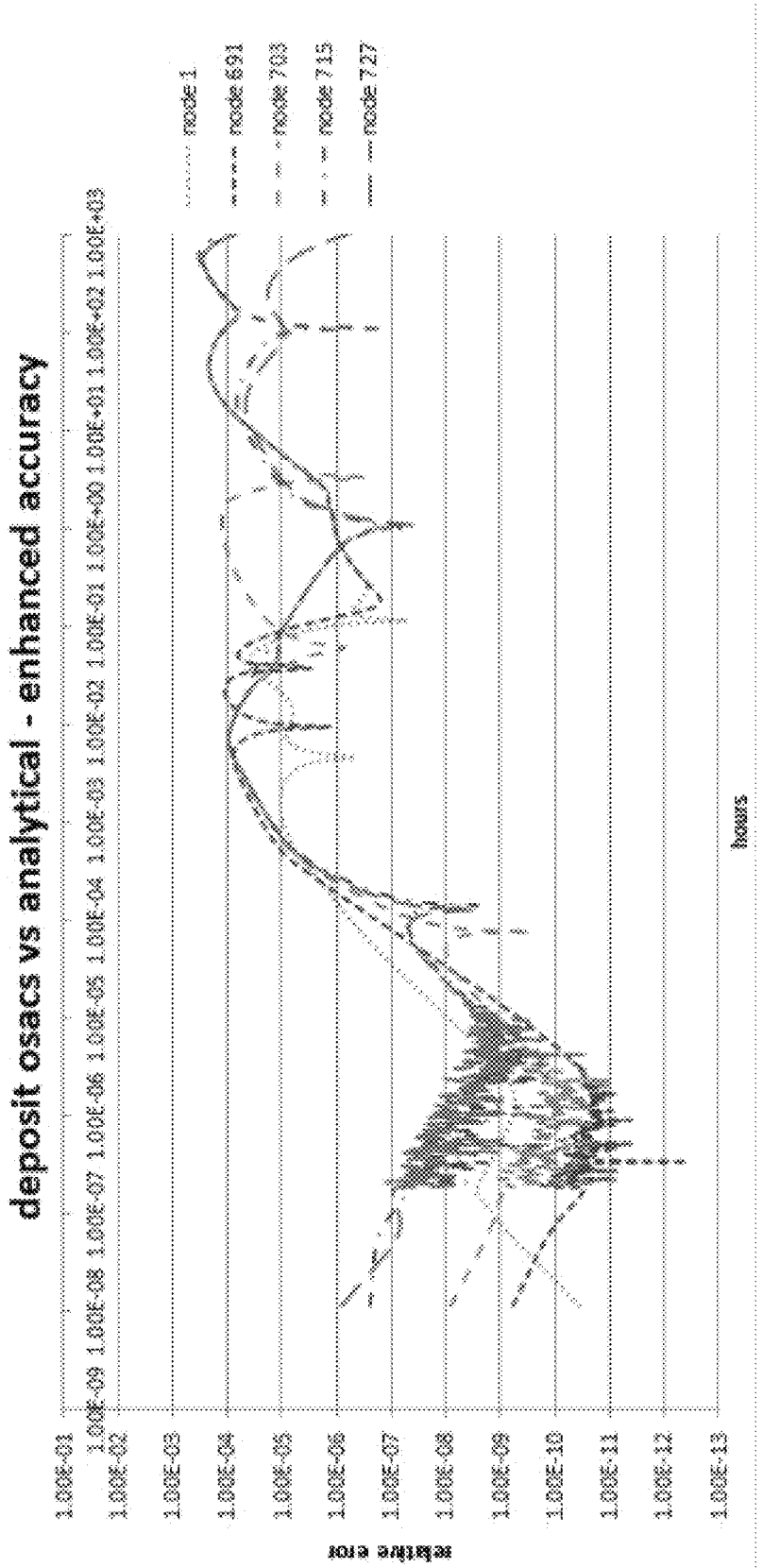
FIG. 8 shows a diagram of the development of the relative error as compared to the analytical solution given a relative accuracy of 0.1% of an embodiment for a geometry whose nodes are at constant but different temperature.
Figure 9:
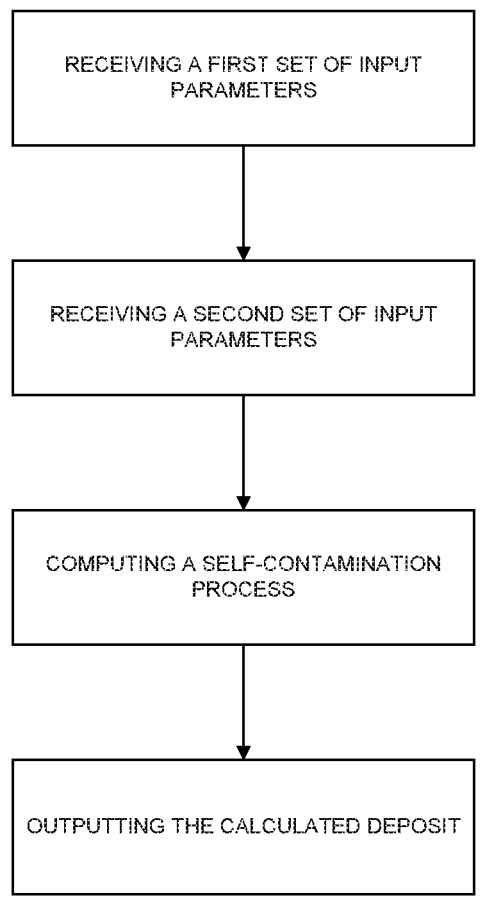
FIG. 9 is a flow chart that illustrates a method for computing self-contamination processes of a spacecraft.

FIG. 8 depicts the results for the nodes at lower temperatures for a required relative accuracy of $10^{-3}$.

The relative error with respect to the correct analytical value that was calculated according to $$1 - \frac{W_{dep,numerical}}{W_{dep,analytical}}$$

stayed below the threshold that was specified for the LTE. The relative error can thus be used to control the absolute error.

The calculation took 87 secs needing 666 iterations.

The present embodiment enables the computation of self-contamination with a computation time, which can be significantly reduced compared to known methods by applying an adaptive stepsize control of a numerical solver used for solving the basic equation for deposit. Moreover, the computed solution is exact within given accuracy requirements. The method can be implemented as part of a software tool suite for spacecraft computations and simulations.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the embodiment in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the embodiment as set forth in the appended claims and their legal equivalents.

What is claimed is:

1. A method for computing self-contamination processes of a spacecraft by means of a data processing device comprising the following steps:

receiving a first set of input parameters comprising general definitions of the spacecraft, receiving a second set of input parameters comprising control parameters for the spacecraft orbital data, physics, numeric, and a predetermined accuracy requirement of the computation, computing a self-contamination process of the spacecraft based on the received first and second sets of input data by either evaluating the analytical solution of an equation of emission or numerically solving the equation of emission $$\dot{W}_{dep,i} = \left(\frac{F_{ji} - \delta_{ij}}{\tau_{r,j}}\right) W_{dep,j} + F_{ji} \dot{W}_{emitted,j}$$

for calculating a deposit of molecules outgassed from surfaces of the spacecraft with a numerical solver with the data processing device, wherein the numerical solver applies an adaptive stepsize control based on the predetermined accuracy requirement of the computation, wherein $F_{ji}$ denotes a view factor from node j, first surface mesh element, to node i, second surface mesh element, $\delta_{ij}$ denotes the Kronecker delta from node i to node j, $\tau_{r,j}$ denotes the temperature-dependent reemission time of node j, $\tau_{e,j}$ denotes the temperature-dependent emission time of node j, and wherein calculation of a deposit of molecules outgassed from surfaces of the spacecraft with a numerical solver comprises a stepwise analytical integration of the emission term $W_{emittable}$ of the equation of emission according to the following equation:

$$\Delta W_{emittable,j} = W_{emittable,j}(t_n)\left(1 - \left(\frac{\tau_{e,j}(t_n)}{\tau_{e,j}(t_n) + \alpha_j h}\right)^{\frac{1}{\alpha_j}}\right),$$

with $\alpha_j$ being the secant slope defined by $$\alpha_j = \frac{\tau_{e,j}(t_{n+1}) - \tau_{e,j}(t_n)}{t_{n+1} - t_n},$$

$\tau_e$ designating time dependent material parameters, and h designating the time interval $h = t_{n+1} - t_n$, and outputting the calculated deposit;

wherein the numerical solver applies a theta-method for calculating an analytical solution of the equation of emission for calculating a deposit of molecules outgassed from surfaces of the spacecraft and adapts the stepsize of the theta-method by performing the following steps:

a) choosing an initial stepsize $h_{lte}$ and setting it as actual stepsize, b) calculating the local truncation error LTE of the theta-method for one step with the actual stepsize, c) calculating the stepsize for the next step depending on the calculated local truncation error LTE and setting the calculated stepsize for the next step as actual stepsize, d) repeating steps b) and c); and wherein calculating of the stepsize $h_{tol}$ for the next step depending on the calculated local truncation error is performed according to the following equation:

$$h_{tol} = \min\left(h_{lte}\sqrt{\frac{TOL_m}{LTE_m(\Theta_{prop})}}\right)$$

with $h_{lte}$ designating the chosen initial stepsize, $\Theta_{prop}$ being either $\Theta_1$ or $\Theta_2$ depending on which one is selected as a propagator, $LTE_m(\Theta_{prop})$ designating the local truncation error calculated for a pair of nodes $W_m$, $V_m$ for the selected theta-method $\Theta_{prop}$, wherein $TOL_m$ designates the predetermined accuracy requirements or tolerances that are applied at time $t_{n+1}$ in the calculation of the next timestep and are selected from two predetermined values $TOL_{m,abs}$ and $TOL_{rel}$ according to the following rule:

if $U_m(t_{n+1}, \Theta_{prop}) > TOL_{m,abs}$ $TOL_m = TOL_{rel} u_m(t_{n+1}, \Theta_{prop})$ else $TOL_m = TOL_{m,abs}$ where $U_m(t_{n+1}, \Theta_{prop})$ is either $W_m(t_{n+1}, \Theta_1)$ or $V_m(t_{n+1}, \Theta_2)$ depending on which one is selected as propagator, and wherein $w(t_{n+1}, \Theta_1) = y(t_n) + h[\Theta_1 f(t_{n+1}, y(t_{n+1})) + (1 - \Theta_1)f(t_n, y(t_n))];$ $v(t_{n+1}, \Theta_2) = y(t_n) + h[\Theta_2 f(t_{n+1}, y(t_{n+1})) + (1 - \Theta_2)f(t_n, y(t_n))];$ and $$LTE_m(\Theta_{prop}) = \left(\frac{1}{2} - \Theta_{prop}\right)\frac{w_m(t_n, \Theta_1) - v_m(t_n, \Theta_2)}{\Theta_1 - \Theta_2},$$

wherein $y(t_n)$ denotes the exact solution of the LTE at a time $t_n$, wherein $y(t_{n+1})$ denotes the exact solution of the LTE at a next time $t_{n+1}$ and wherein $f(t_{n+1}, y(t_{n+1})) = \dot{y}(t_{n+1})$.

2. The method of claim 1, wherein the calculating of the local truncation error LTE of the theta-method comprises
calculating a first local truncation error $LTE_{explicit}$ using the explicit Euler method,
calculating a second local truncation error $LTE_{implicit}$ using the implicit Euler method, and
selecting as the local truncation error LTE the one of the calculated first and second local truncation error $LTE_{explicit}$ and $LTE_{implicit}$, with the smaller magnitude.

3. The method of claim 1, wherein the calculating of the local truncation error LTE of the theta-method is performed according to the following equation:

$$LTE_m(\Theta_{prop}) = \left(\frac{1}{2} - \Theta_{prop}\right)\frac{w_m(t_{n+1}, \Theta_1) - v_m(t_{n+1}, \Theta_2)}{\Theta_1 - \Theta_2}$$

with $\Theta_1$, $\Theta_2$ designating different theta-methods, $\Theta_{prop}$ being either $\Theta_1$ or $\Theta_2$ depending on which one is selected as a propagator, $W_m$, $V_m$ designating the deposit on a pair of nodes or mesh elements of the surface of the spacecraft, which is represented as a collection of surfaces, which are subdivided into mesh elements with outgassing properties.

4. The method of claim 1, wherein $\Theta_1$, $\Theta_2$ are set to the explicit and implicit Euler method with $\Theta_1=0$, $\Theta_2=1$ the implicit Euler method $\Theta_2$ is selected as propagator $\Theta_{prop}$.

5. The method of claim 2, wherein the theta-method comprises a higher order linear multistep method, which is used to calculate the results and/or propagate the solution.

6. The method of claim 1, wherein the calculating of the stepsize for the next step depending on the calculated local truncation error LTE comprises the following steps:
if the local truncation error LTE is smaller than or equal to the predetermined accuracy requirement TOL performing the following steps: accepting the step, calculating an increased stepsize for the next step depending on the calculated local truncation error LTE and setting the increased stepsize as actual stepsize, and
if the local truncation error LTE is larger than the predetermined accuracy requirement TOL performing the following steps: discarding the step, calculating a decreased stepsize for this step depending on the calculated local truncation error LTE and setting the decreased stepsize as actual stepsize.

7. The method of claim 1, wherein the equation used for the stepwise analytical integration of the emission term $W_{emittable}$ of the equation of emission is expanded for small values of $\alpha_j$ to $$\Delta W_{emittable,j} \cong W_{emittable,j}(t_n)\left(1 - \exp\left(-\frac{\Delta t}{\tau_{e,j}(t_n)}\right)\left(1 + \frac{(\Delta t)^2 \alpha_j}{2\tau_{e,j}^2(t_n)}\right)\right).$$

* * * * *